United States Patent
Park et al.

(10) Patent No.: US 8,093,727 B2
(45) Date of Patent: *Jan. 10, 2012

(54) INTEGRATED CIRCUIT PACKAGE-IN-PACKAGE SYSTEM WITH SIDE-BY-SIDE AND OFFSET STACKING AND METHOD FOR MANUFACTURING THEREOF

(75) Inventors: Soo-San Park, Seoul (KR); BumJoon Hong, Seoul (KR); Sang-Ho Lee, Yeoju (KR); Jong-Woo Ha, Seoul (KR)

(73) Assignee: STATS Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/871,031

(22) Filed: Aug. 30, 2010

(65) Prior Publication Data

US 2010/0320621 A1    Dec. 23, 2010

Related U.S. Application Data

(63) Continuation of application No. 11/849,087, filed on Aug. 31, 2007, now Pat. No. 7,812,435.

(51) Int. Cl.
*H01L 23/538* (2006.01)

(52) U.S. Cl. ............. 257/777; 257/778; 257/E21.511; 257/E23.169; 438/108; 438/109

(58) Field of Classification Search ............ 257/737, 257/778, 690, 685, 686, 723, 777, E23.169, 257/E21.511; 438/108, 9

See application file for complete search history.

(56) References Cited

U.S. PATENT DOCUMENTS

| | | |
|---|---|---|
| 5,784,261 A | 7/1998 | Pedder |
| 6,201,266 B1 | 3/2001 | Ohuchi et al. |
| 6,558,978 B1 | 5/2003 | McCormick |
| 6,762,488 B2 | 7/2004 | Maeda et al. |
| 7,008,822 B2 | 3/2006 | Bolken et al. |
| 7,053,476 B2 | 5/2006 | Karnezos |
| 7,061,087 B2 | 6/2006 | Kim |
| 7,132,753 B1 | 11/2006 | St. Amand et al. |
| 7,227,252 B2 | 6/2007 | Bolken et al. |
| 7,253,511 B2 | 8/2007 | Karnezos et al. |
| 7,420,269 B2 | 9/2008 | Ha et al. |
| 7,518,224 B2 | 4/2009 | Shim et al. |
| 2005/0230801 A1 | 10/2005 | Kuroda et al. |
| 2006/0256525 A1 | 11/2006 | Shim et al. |
| 2007/0001296 A1 | 1/2007 | Lee et al. |
| 2007/0052082 A1 | 3/2007 | Lee et al. |
| 2007/0108581 A1 | 5/2007 | Shim et al. |
| 2008/0157318 A1 | 7/2008 | Chow et al. |

*Primary Examiner* — Roy Potter
(74) *Attorney, Agent, or Firm* — Mikio Ishimaru

(57) ABSTRACT

A method for manufacturing of an integrated circuit package-in-package system includes: mounting a first integrated circuit device over a substrate; mounting an integrated circuit package system having an inner encapsulation over the first integrated circuit device with a first offset; mounting a second integrated circuit device over the first integrated circuit device and adjacent to the integrated circuit package system; connecting the integrated circuit package system and the substrate; and forming a package encapsulation as a cover for the first integrated circuit device, the integrated circuit package system, and the second integrated circuit device.

17 Claims, 3 Drawing Sheets

INTEGRATED CIRCUIT PACKAGE-IN-PACKAGE SYSTEM WITH SIDE-BY-SIDE AND OFFSET STACKING AND METHOD FOR MANUFACTURING THEREOF

CROSS-REFERENCE TO RELATED APPLICATION(S)

This is a continuation of U.S. patent application Ser. No. 11/849,087, now U.S. Pat. No. 7,812,435, filed Aug. 31, 2007.

TECHNICAL FIELD

The present invention relates generally to an integrated circuit package system and more particularly to an integrated circuit package-in-package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

Numerous package approaches stack multiple integrated circuit dice, package-in-package (PIP), or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction.

Multi-chip packages whether vertically or horizontally arranged, can also present problems because they usually must be assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, multi-chip packages provide integration solutions for packing more integrated circuits and components into a single package. However, market driven requirements continue to drive conventional multi-chip packages to smaller and smaller form factors.

Thus, a need still remains for an integrated circuit package-in-package system providing smaller form factor, low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing of an integrated circuit package-in-package system including: mounting a first integrated circuit device over a substrate; mounting an integrated circuit package system having an inner encapsulation over the first integrated circuit device with a first offset; mounting a second integrated circuit device over the first integrated circuit device and adjacent to the integrated circuit package system; connecting the integrated circuit package system and the substrate; and forming a package encapsulation as a cover for the first integrated circuit device, the integrated circuit package system, and the second integrated circuit device.

The present invention provides an integrated circuit package-in-package system including: a substrate; a first integrated circuit device mounted over the substrate; an integrated circuit package system having an inner encapsulation over the first integrated circuit device with a first offset and connected with the substrate; a second integrated circuit device over the first integrated circuit device and adjacent to the integrated circuit package system; and a package encapsulation as a cover for the first integrated circuit device, the integrated circuit package system, and the second integrated circuit device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
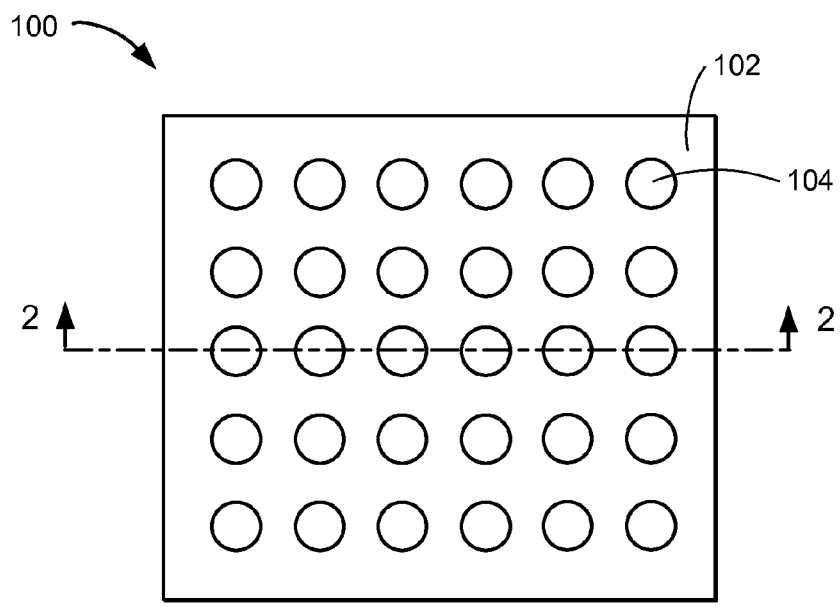
FIG. 1 is a bottom view of an integrated circuit package-in-package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package-in-package system 100 in a first embodiment of the present invention. The bottom view depicts a substrate 102, such as a laminated plastic or ceramic substrate, with external interconnects 104, such as solder balls, preferably attached to the substrate 102. For illustrative purposes, the external interconnects 104 are shown in an array configuration, although it is understood that the external interconnects 104 may populate the substrate 102 in a different configuration. For example, the external interconnects 104 may not populate all the locations of the array configuration.

Figure 2:
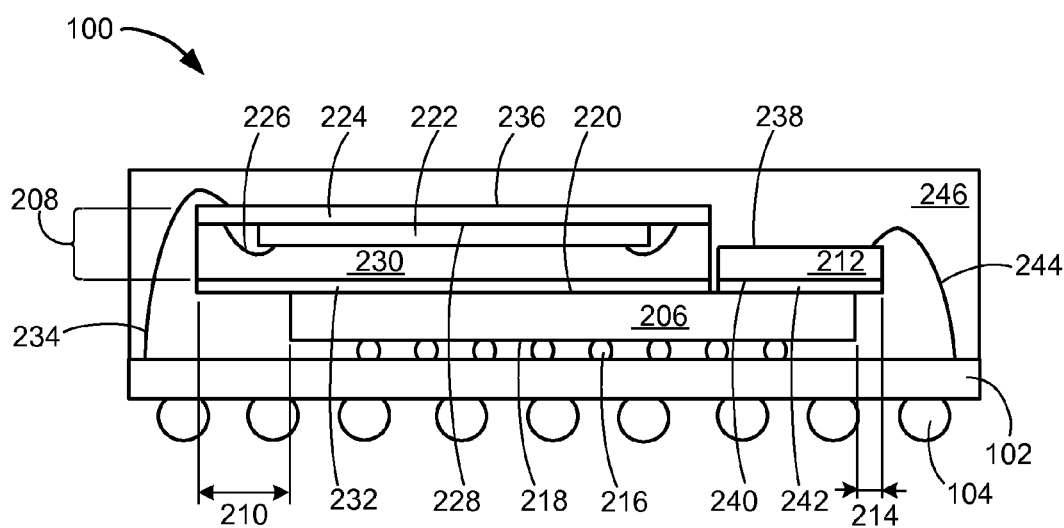
FIG. 2 is a cross-sectional view of the integrated circuit package-in-package system along line 2-2 of FIG. 1.

Referring now to FIG. 2, therein is shown a cross-sectional view of the integrated circuit package-in-package system 100 along line 2-2 of FIG. 1. As described earlier, the external interconnects 104 are preferably attached below the substrate 102. A first integrated circuit device 206 preferably mounts over the substrate 102. An integrated circuit package system 208 preferably mounts over the first integrated circuit device 206, wherein the integrated circuit package system 208 is shown, as an example, with a first offset 210 from the edge of the first integrated circuit device 206. A second integrated circuit device 212 is preferably adjacent, such as side-by-side, to the integrated circuit package system 208 and over the first integrated circuit device 206. The second integrated circuit device 212 is shown, as an example, with a second offset 214 from a different edge of the first integrated circuit device 206.

As additional description to this example, the first integrated circuit device 206 is shown as a flip chip having electrical connectors 216, such as solder bumps, at a first active side 218 of the first integrated circuit device 206, wherein the first active side 218 includes active circuitry (not shown) fabricated thereon. The first active side 218 faces the substrate 102 with the electrical connectors 216 connected between the first active side 218 and the substrate 102. The first integrated circuit device 206 also includes a first non-active side 220 at an opposing side of the first active side 218.

The integrated circuit package system 208 includes an integrated circuit die 222 preferably mounted to a carrier 224, such as a substrate or interposer. Inner interconnects 226, such as bond wires or ribbon bond wires, connect the integrated circuit die 222 and a first side 228 of the carrier 224. An inner encapsulation 230, such as an epoxy molding compound, covers the integrated circuit die 222, the inner interconnects 226, and the first side 228 of the carrier 224.

The integrated circuit package system 208 preferably mounts over the first integrated circuit device 206 with a first adhesive 232, such as a film adhesive, between the inner encapsulation 230 and the first non-active side 220. The first adhesive 232 is also shown along the horizontal portion of the inner encapsulation 230 at the first offset 210. First internal interconnects 234, such as bond wires or ribbon bond wires, preferably connect between a second side 236 of the carrier 224 and the substrate 102, wherein the second side 236 is at an opposing side to the first side 228.

The second integrated circuit device 212, as an example, is shown as an integrated circuit die having a second active side 238 and a second non-active side 240, wherein the second active side 238 includes active circuitry (not shown) fabricated thereon. The second integrated circuit device 212 preferably mounts over the first integrated circuit device 206 with a second adhesive 242, such as a die-attach adhesive, between the second non-active side 240 and the first non-active side 220. The second adhesive 242 is also shown along the second non-active side 240 at the second offset 214. The first adhesive 232 and the second adhesive 242 may include substantially the same materials or may be different. Second internal interconnects 244, such as bond wires or ribbon bond wires, may connect between the second active side 238 and the substrate 102.

A package encapsulation 246, such as an epoxy molding compound, covers the first integrated circuit device 206, the integrated circuit package system 208, the second integrated circuit device 212, the first internal interconnects 234, and the second internal interconnects 244 over the substrate 102. The package encapsulation 246 preferably fills the space underneath the first offset 210 and the second offset 214.

Figure 3:
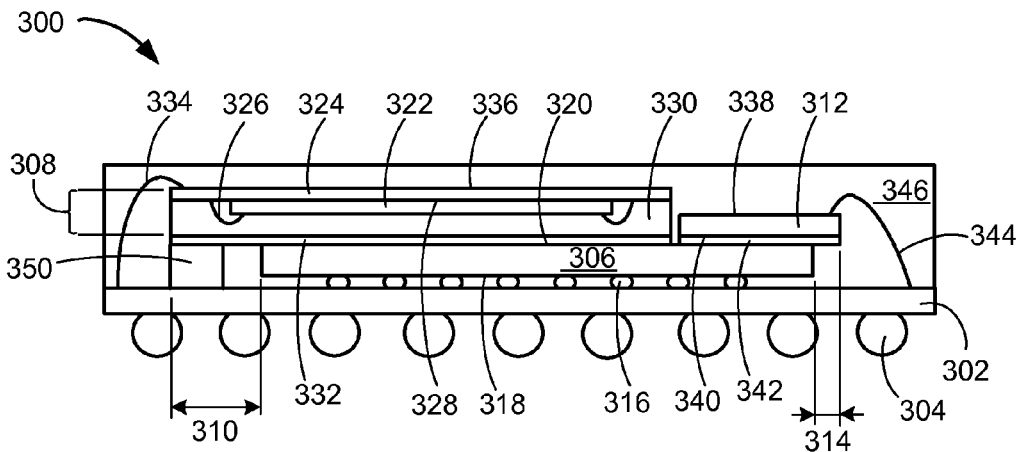
FIG. 3 is a cross-sectional view of an integrated circuit package-in-package system exemplified by the top view of FIG. 1 in a second embodiment of the present invention.

Referring now to FIG. 3, therein is shown a cross-sectional view of an integrated circuit package-in-package system 300 exemplified by the top view of FIG. 1 in a second embodiment of the present invention. External interconnects 304, such as solder balls, are preferably attached below a substrate 302, such as a plastic or ceramic substrate. A first integrated circuit device 306 preferably mounts over the substrate 302. An integrated circuit package system 308 preferably mounts over the first integrated circuit device 306, wherein the integrated circuit package system 308 is shown, as an example, with a first offset 310 from the edge of the first integrated circuit device 306. A second integrated circuit device 312 is preferably adjacent, such as side-by-side, to the integrated circuit package system 308 and over the first integrated circuit device 306. The second integrated circuit device 312 is shown, as an example, with a second offset 314 from a different edge of the first integrated circuit device 306.

As additional description to this example, the first integrated circuit device 306 is shown as a flip chip having electrical connectors 316, such as solder bumps, at a first active side 318 of the first integrated circuit device 306, wherein the first active side 318 includes active circuitry (not shown) fabricated thereon. The first active side 318 faces the substrate 302 with the electrical connectors 316 connected between the first active side 318 and the substrate 302. The first integrated circuit device 306 also includes a first non-active side 320 at an opposing side of the first active side 318.

The integrated circuit package system 308 includes an integrated circuit die 322 preferably mounted to a carrier 324, such as a substrate or interposer. Inner interconnects 326, such as bond wires or ribbon bond wires, connect the integrated circuit die 322 and a first side 328 of the carrier 324. An inner encapsulation 330, such as an epoxy molding compound, covers the integrated circuit die 322, the inner interconnects 326, and the first side 328 of the carrier 324.

The integrated circuit package system 308 preferably mounts over the first integrated circuit device 306 with a first adhesive 332, such as a film adhesive, between the inner encapsulation 330 and the first non-active side 320. A support structure 350, such as an epoxy film or a passive component, preferably supports the integrated circuit package system 308 at the first offset 310. The support structure 350 is adjacent to the first integrated circuit device 306 and has substantially the same or similar height to the first integrated circuit device 306 from the substrate 302. The first adhesive 332 is sufficiently malleable to mitigate or accommodate minor height differences between the first integrated circuit device 306 and the support structure 350.

The first adhesive 332 is also shown along the horizontal portion of the inner encapsulation 330 at the first offset 310 and also between the inner encapsulation 330 and the support structure 350. First internal interconnects 334, such as bond wires or ribbon bond wires, preferably connect between a second side 336 of the carrier 324 and the substrate 302, wherein the second side 336 is at an opposing side to the first side 328.

The second integrated circuit device 312, as an example, is shown as an integrated circuit die having a second active side 338 and a second non-active side 340, wherein the second active side 338 includes active circuitry (not shown) fabricated thereon. The second integrated circuit device 312 preferably mounts over the first integrated circuit device 306 with a second adhesive 342, such as a die-attach adhesive, between the second non-active side 340 and the first non-active side 320. The second adhesive 342 is also shown along the second non-active side 340 at the second offset 314. The first adhesive 332 and the second adhesive 342 may include substantially the same materials or may be different. Second internal interconnects 344, such as bond wires or ribbon bond wires, may connect between the second active side 338 and the substrate 302.

A package encapsulation 346, such as an epoxy molding compound, covers the first integrated circuit device 306, the integrated circuit package system 308, the second integrated circuit device 312, the first internal interconnects 334, and the second internal interconnects 344 over the substrate 302. The package encapsulation 346 preferably fills the space underneath the first offset 310 and the second offset 314.

Figure 4:
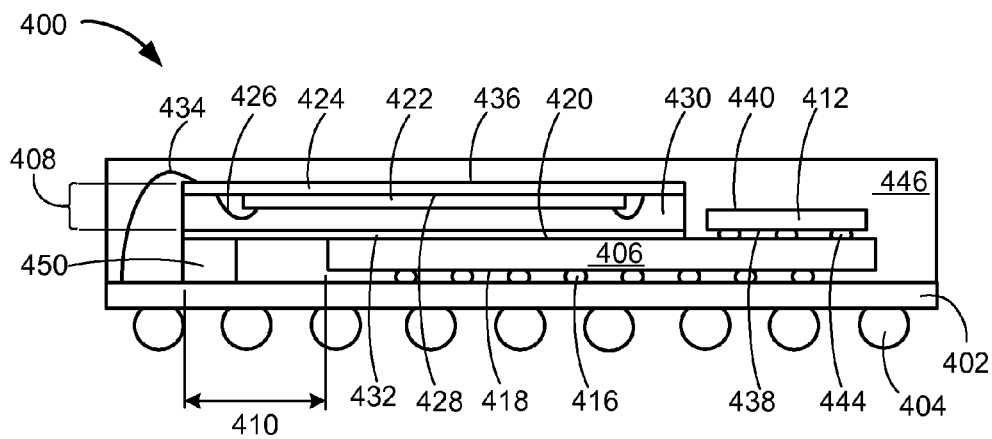
FIG. 4 is a cross-sectional view of an integrated circuit package-in-package system exemplified by the top view of FIG. 1 in a third embodiment of the present invention.

Referring now to FIG. 4, therein is shown a cross-sectional view of an integrated circuit package-in-package system 400 exemplified by the top view of FIG. 1 in a third embodiment of the present invention. External interconnects 404, such as solder balls, are preferably attached below a substrate 402, such as a plastic or ceramic substrate. A first integrated circuit device 406 preferably mounts over the substrate 402. An integrated circuit package system 408 preferably mounts over the first integrated circuit device 406, wherein the integrated circuit package system 408 is shown, as an example, with a first offset 410 from the edge of the first integrated circuit device 406. A second integrated circuit device 412 is preferably adjacent, such as side-by-side, to the integrated circuit package system 408 and over the first integrated circuit device 406.

As additional description to this example, the first integrated circuit device 406 is shown as a flip chip having electrical connectors 416, such as solder bumps, at a first active side 418 of the first integrated circuit device 406, wherein the first active side 418 includes active circuitry (not shown) fabricated thereon. The first active side 418 faces the substrate 402 with the electrical connectors 416 connected between the first active side 418 and the substrate 402. The first integrated circuit device 406 also includes a first non-active side 420 at an opposing side of the first active side 418.

The integrated circuit package system 408 includes an integrated circuit die 422 preferably mounted to a carrier 424, such as a substrate or interposer. Inner interconnects 426, such as bond wires or ribbon bond wires, connect the integrated circuit die 422 and a first side 428 of the carrier 424. An inner encapsulation 430, such as an epoxy molding compound, covers the integrated circuit die 422, the inner interconnects 426, and the first side 428 of the carrier 424.

The integrated circuit package system 408 preferably mounts over the first integrated circuit device 406 with a first adhesive 432, such as a film adhesive, between the inner encapsulation 430 and the first non-active side 420. A support structure 450, such as an epoxy film or a passive component, preferably supports the integrated circuit package system 408 at the first offset 410. The support structure 450 is adjacent to the first integrated circuit device 406 and has substantially the same or similar height to the first integrated circuit device 406 from the substrate 402. The first adhesive 432 is sufficiently malleable to mitigate or accommodate minor height differences between the first integrated circuit device 406 and the support structure 450.

The first adhesive 432 is also shown along the horizontal portion of the inner encapsulation 430 at the first offset 410 and also between the inner encapsulation 430 and the support structure 450. First internal interconnects 434, such as bond wires or ribbon bond wires, preferably connect between a second side 436 of the carrier 424 and the substrate 402, wherein the second side 436 is at an opposing side to the first side 428.

The second integrated circuit device 412, as an example, is shown as an integrated circuit die having a second active side 438 and a second non-active side 440, wherein the second active side 438 includes active circuitry (not shown) fabricated thereon. The second integrated circuit device 412 preferably mounts over the first integrated circuit device 406 with the second active side 438 facing the first non-active side 420.

Second internal interconnects 444, such as solder bumps, may connect between the second active side 438 and the first non-active side 420, wherein the second internal interconnects 444 preferably attach to terminals (not shown) exposed at the first non-active side 420. The terminals at the first non-active side 420 preferably connect to the first active side 418 with vias (not shown) through the first integrated circuit device 406.

A package encapsulation 446, such as an epoxy molding compound, covers the first integrated circuit device 406, the integrated circuit package system 408, the second integrated circuit device 412, the first internal interconnects 434, and the second internal interconnects 444 over the substrate 402. The package encapsulation 446 preferably fills the space underneath the first offset 410.

Figure 5:
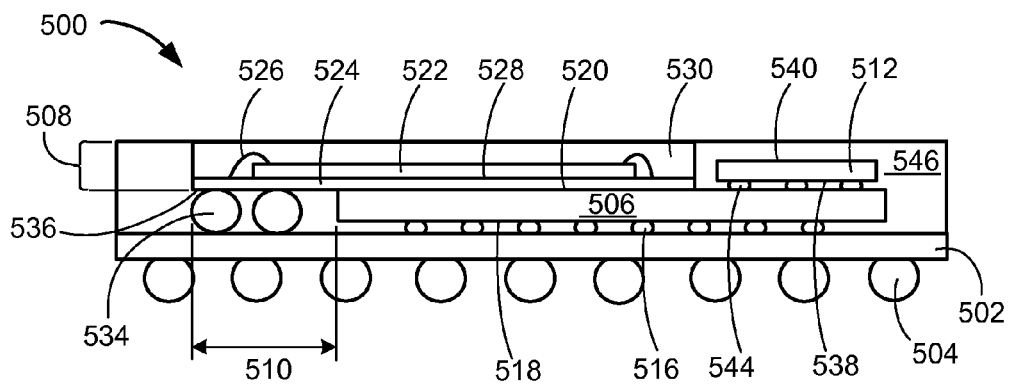
FIG. 5 is a cross-sectional view of an integrated circuit package-in-package system exemplified by the top view of FIG. 1 in a fourth embodiment of the present invention.

Referring now to FIG. 5, therein is shown a cross-sectional view of an integrated circuit package-in-package system 500 exemplified by the top view of FIG. 1 in a fourth embodiment of the present invention. External interconnects 504, such as solder balls, are preferably attached below a substrate 502, such as a plastic or ceramic substrate. A first integrated circuit device 506 preferably mounts over the substrate 502. An integrated circuit package system 508 preferably mounts over the first integrated circuit device 506, wherein the integrated circuit package system 508 is shown, as an example, with a first offset 510 from the edge of the first integrated circuit device 506. A second integrated circuit device 512 is preferably adjacent, such as side-by-side, to the integrated circuit package system 508 and over the first integrated circuit device 506.

As additional description to this example, the first integrated circuit device 506 is shown as a flip chip having electrical connectors 516, such as solder bumps, at a first active side 518 of the first integrated circuit device 506, wherein the first active side 518 includes active circuitry (not shown) fabricated thereon. The first active side 518 faces the substrate 502 with the electrical connectors 516 connected between the first active side 518 and the substrate 502. The first integrated circuit device 506 also includes a first non-active side 520 at an opposing side of the first active side 518.

The integrated circuit package system 508 includes an integrated circuit die 522 preferably mounted to a carrier 524, such as a substrate or interposer. Inner interconnects 526, such as bond wires or ribbon bond wires, connect the integrated circuit die 522 and a first side 528 of the carrier 524. An inner encapsulation 530, such as an epoxy molding compound, covers the integrated circuit die 522, the inner interconnects 526, and the first side 528 of the carrier 524.

The integrated circuit package system 508 preferably mounts over the first integrated circuit device 506 with a second side 536 of the carrier 524 facing the first non-active side 520, wherein the second side 536 is at an opposing side to the first side 528. First internal interconnects 534, such as solder balls, preferably connects the second side 536 and the substrate 502 at the first offset 510. The first internal interconnects 534 also supports the integrated circuit package system 508 at the first offset 510. The first internal interconnects 534 is adjacent to the first integrated circuit device 506 and has substantially the same or similar height to the first integrated circuit device 506 from the substrate 502.

The second integrated circuit device 512, as an example, is shown as an integrated circuit die having a second active side 538 and a second non-active side 540, wherein the second active side 538 includes active circuitry (not shown) fabricated thereon. The second integrated circuit device 512 preferably mounts over the first integrated circuit device 506 with the second active side 538 facing the first non-active side 520.

Second internal interconnects 544, such as solder bumps, may connect between the second active side 538 and the first non-active side 520, wherein the second internal interconnects 544 preferably attach to terminals (not shown) exposed at the first non-active side 520. The terminals at the first non-active side 520 preferably connect to the first active side 518 with vias (not shown) through the first integrated circuit device 506.

A package encapsulation 546, such as an epoxy molding compound, covers the first integrated circuit device 506, the second integrated circuit device 512, the first internal interconnects 534, and the second internal interconnects 544 over the substrate 502. The package encapsulation 546 partially covers the integrated circuit package system 508 exposing the inner encapsulation 530 minimizing the height of the integrated circuit package-in-package system 500. The package encapsulation 546 preferably fills the space underneath the first offset 510.

Figure 6:
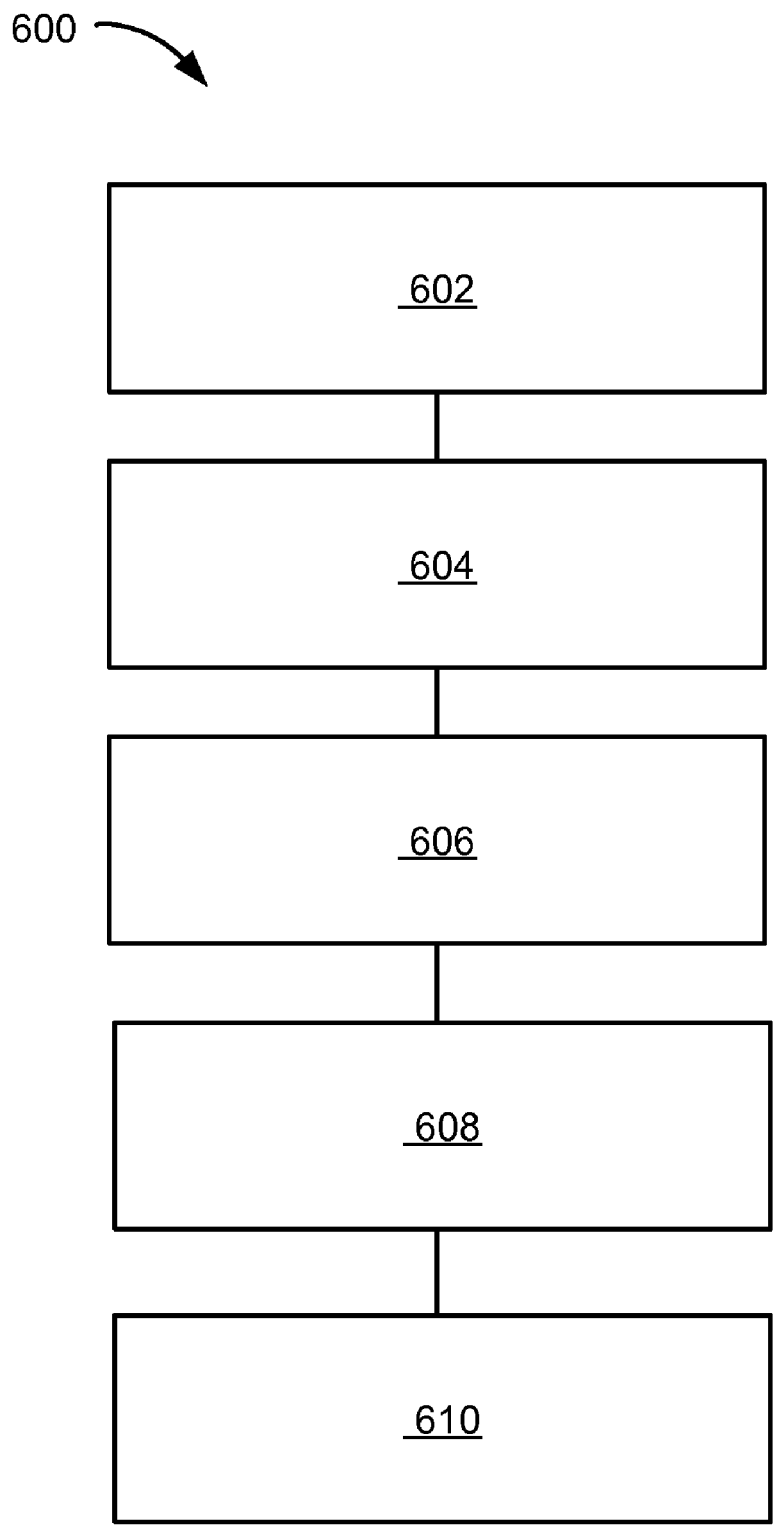
FIG. 6 is a flow chart of an integrated circuit package-in-package system for manufacturing of the integrated circuit package-in-package system in an embodiment of the present invention.

Referring now to FIG. 6, therein is shown a flow chart of an integrated circuit package-in-package system 600 for manufacturing the integrated circuit package-in-package system 100 in an embodiment of the present invention. The system 600 includes mounting a first integrated circuit device over a substrate in a block 602; mounting an integrated circuit package system having an inner encapsulation over the first integrated circuit device with a first offset in a block 604; mounting a second integrated circuit device over the first integrated circuit device and adjacent to the integrated circuit package system in a block 606; connecting the integrated circuit package system and the substrate in a block 608; and forming a package encapsulation as a cover for the first integrated circuit device, the integrated circuit package system, and the second integrated circuit device in a block 610.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings re to be interpreted in an illustrative and non-limiting sense.

What is claimed is:

1. A method for manufacturing of an integrated circuit package-in-package system comprising:
   mounting a first integrated circuit device over a substrate;
   mounting an integrated circuit package system having an inner encapsulation over the first integrated circuit device with a first offset;
   mounting a second integrated circuit device over the first integrated circuit device and adjacent to the integrated circuit package system;
   connecting the integrated circuit package system and the substrate; and forming a package encapsulation as a cover for the first integrated circuit device, the integrated circuit package system, and the second integrated circuit device.

2. The method as claimed in claim 1 wherein mounting the first integrated circuit device over the substrate includes connecting a flip chip to the substrate.

3. The method as claimed in claim 1 wherein mounting the integrated circuit package system having the inner encapsulation over the first integrated circuit device with the first offset includes:
   providing a support structure over the substrate at the first offset; and
   mounting the integrated circuit package system over the support structure.

4. The method as claimed in claim 1 wherein mounting the integrated circuit package system having the inner encapsulation over the first integrated circuit device with the first offset includes:
   providing a carrier of the integrated circuit package system facing the first integrated circuit device; and
   connecting a first internal interconnect at the first offset between the carrier and the substrate.

5. A method for manufacturing of an integrated circuit package-in-package system comprising:
   mounting a flip chip over a substrate;
   mounting an integrated circuit package system having both a carrier and an inner encapsulation over the flip chip with a first offset;
   mounting a second integrated circuit device over the flip chip and adjacent to the integrated circuit package system;
   connecting the integrated circuit package system and the substrate; and
   forming a package encapsulation as a cover for the flip chip, the integrated circuit package system, and the second integrated circuit device.

6. The method as claimed in claim 5 wherein:
   mounting the integrated circuit package system having both the carrier and the inner encapsulation over the flip chip with the first offset includes:
      placing the carrier facing the flip chip;
      connecting a first internal interconnect at the first offset between the carrier and the substrate; and
   forming the package encapsulation includes:
      exposing the inner encapsulation.

7. The method as claimed in claim 5 wherein mounting the integrated circuit package system having the inner encapsulation over the flip chip with the first offset includes:
   providing a support structure over the substrate at the first offset; and
   mounting the integrated circuit package system over the support structure with the inner encapsulation facing the support structure.

8. The method as claimed in claim 5 further comprising attaching an external interconnect under the substrate.

9. An integrated circuit package-in-package system comprising:
   a substrate;
   a first integrated circuit device mounted over the substrate;
   an integrated circuit package system having an inner encapsulation over the first integrated circuit device with a first offset and connected with the substrate;
   a second integrated circuit device over the first integrated circuit device and adjacent to the integrated circuit package system; and
   a package encapsulation as a cover for the first integrated circuit device, the integrated circuit package system, and the second integrated circuit device.

10. The system as claimed in claim 9 wherein the first integrated circuit device mounted over the substrate includes a flip chip connected to the substrate.

11. The system as claimed in of claim 9 further comprising:
   a support structure over the substrate at the first offset; and
wherein:
   the integrated circuit package system is over the support structure.

12. The system as claimed in claim 9 wherein:
   the integrated circuit package system includes a carrier facing the first integrated circuit device; and
further comprising:
   a first internal interconnect at the first offset between the carrier and the substrate.

13. The system as claimed in claim 9 wherein:
   the first integrated circuit device includes a flip chip; and
   the integrated circuit package system includes a carrier.

14. The system as claimed in claim 13 wherein the second integrated circuit device includes an integrated circuit die mounted with a second offset to the flip chip and connected with the substrate.

15. The system as claimed in of claim 13 wherein:
   the integrated circuit package system includes:
      the carrier facing the flip chip;
      a first internal interconnect connected between the carrier and the substrate at the first offset; and
   the package encapsulation includes:
      the inner encapsulation exposed from the package encapsulation.

16. The system as claimed in claim 13 further comprising:
   a support structure over the substrate at the first offset; and
wherein:
   the integrated circuit package system mounted over the support structure with the inner encapsulation facing the support structure.

17. The system as claimed in claim 13 further comprising an external interconnect under the substrate.

* * * * *